(12) United States Patent
Liu et al.

(10) Patent No.: US 7,858,519 B2
(45) Date of Patent: Dec. 28, 2010

(54) INTEGRATED CIRCUIT AND MANUFACTURING METHOD OF COPPER GERMANIDE AND COPPER SILICIDE AS COPPER CAPPING LAYER

(75) Inventors: Chung-Shi Liu, Tervuren (BE); Chen-Hua Yu, Hsin-Chu (TW)

(73) Assignees: IMEC, Leuven (BE); Taiwan Semiconductor Manufacturing Company, Ltd. (TSMC), Hsin-chu (TW)

( * ) Notice: Subject to any disclaimer, the term of this patent is extended or adjusted under 35 U.S.C. 154(b) by 247 days.

(21) Appl. No.: 12/264,095

(22) Filed: Nov. 3, 2008

(65) Prior Publication Data

US 2009/0134521 A1    May 28, 2009

Related U.S. Application Data

(60) Provisional application No. 60/990,585, filed on Nov. 27, 2007.

(30) Foreign Application Priority Data

May 30, 2008    (EP)    ................... 08157374

(51) Int. Cl.
*H01L 21/44*    (2006.01)

(52) U.S. Cl. .............. 438/653; 438/631; 438/687; 257/E21.476; 257/751; 257/758; 257/774

(58) Field of Classification Search .......... 257/E21.476, 257/E23.141, E21.582, E21.592, 751, 758, 257/762, 774; 438/631, 653, 678, 687, 763
See application file for complete search history.

(56) References Cited

U.S. PATENT DOCUMENTS 6,358,840 B1    3/2002    Wang et al.

(Continued)

OTHER PUBLICATIONS

Chhun et al., "Impact of introducing CuSiN self-aligned barriers in advanced copper interconnects", Microelectronic Engineering, 82 (2005) 587-593.

(Continued)

*Primary Examiner*—Chris Chu
(74) *Attorney, Agent, or Firm*—Knobbe Martens Olson & Bear LLP

(57) ABSTRACT

A method is provided for forming a capping layer comprising Cu, N, and also Si and/or Ge onto a copper conductive structure, said method comprising the sequential steps of: forming, at a temperature range between 200° C. up to 400° C., at least one capping layer onto said copper conductive structure by exposing said structure to a $GeH_4$ and/or a $SiH_4$ comprising ambient, performing a $NH_3$ plasma treatment thereby forming an at least partly nitrided capping layer, forming a dielectric barrier layer onto said at least partly nitrided capping layer, wherein prior to said step of forming said at least one capping layer a pre-annealing step of said copper conductive structure is performed at a temperature range between 250° C. up to 450° C.

16 Claims, 4 Drawing Sheets

U.S. PATENT DOCUMENTS

| | | | |
|---|---|---|---|
| 6,806,191 B2 * | 10/2004 | Zistl et al. | 438/687 |
| 6,821,890 B2 | 11/2004 | McGahay et al. | |
| 7,413,985 B2 * | 8/2008 | Streck et al. | 438/687 |
| 7,524,755 B2 * | 4/2009 | Widodo et al. | 438/627 |
| 7,718,548 B2 * | 5/2010 | Lee et al. | 438/775 |
| 7,727,880 B1 * | 6/2010 | Chattopadhyay et al. | 438/622 |
| 7,745,937 B2 * | 6/2010 | Usami et al. | 257/762 |
| 7,755,202 B2 * | 7/2010 | Hayashi et al. | 257/774 |
| 2002/0155702 A1 | 10/2002 | Aoki et al. | |
| 2003/0224599 A1 | 12/2003 | Zistl et al. | |
| 2005/0147762 A1 * | 7/2005 | Dubin et al. | 427/437 |
| 2006/0138670 A1 | 6/2006 | Lee | |
| 2007/0075428 A1 | 4/2007 | Wang et al. | |

OTHER PUBLICATIONS

Gosset et al., Self Aligned Barrier Approach: Overview on Process, Module Integration and Interconnect Performance Improvement Challenges, International Interconnect Technology Conference, 2006 IEEE.

Usami et al., Highly Reliable Interface of Self-aligned CuSiN process with Low-κ SiC barrier dielectric (κ=3.5) for 65nm node and beyond, International Interconnect Technology Conference, 2006 IEEE.

Chhun et al., "Cu surface treatment influence on Si adsorption properties of CuSiN self-aligned barriers for sub-65 nm technology node", Microelectronic Engineering 83 (2006) 2094-2100.

* cited by examiner

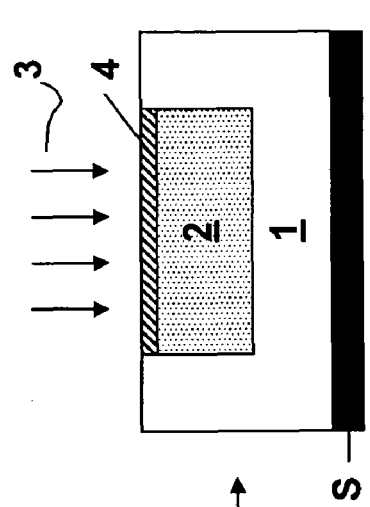
Figure 1A
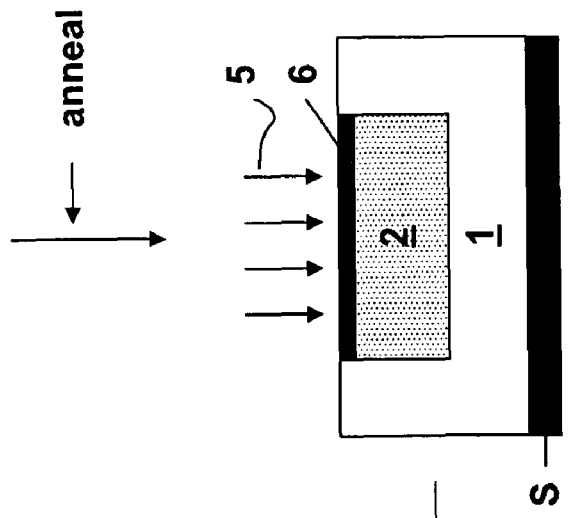
Figure 1B
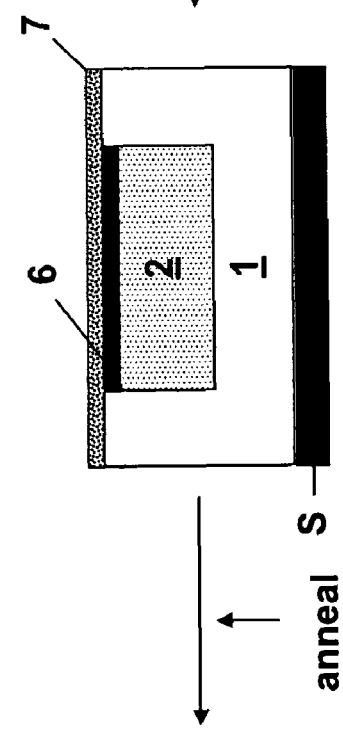
Figure 1C
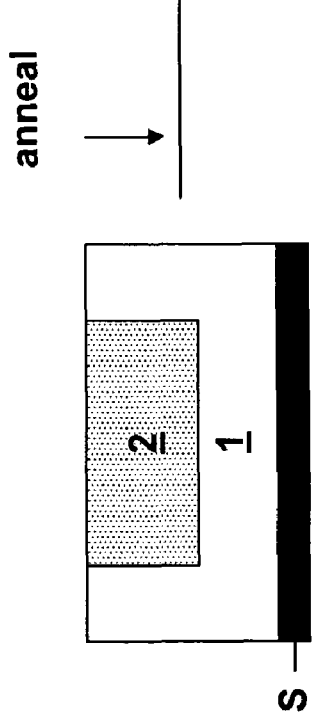
Figure 1D
FIG. 1

INTEGRATED CIRCUIT AND MANUFACTURING METHOD OF COPPER GERMANIDE AND COPPER SILICIDE AS COPPER CAPPING LAYER

CROSS-REFERENCE TO RELATED APPLICATIONS

This application claims the benefit under 35 U.S.C. §119 (e) of U.S. provisional application Ser. No. 60/990,585, filed Nov. 27, 2007, and claims the benefit under 35 U.S.C. §119 (a)-(d) of European application No. 08157374.3, filed May 30, 2008, the disclosures of which are hereby expressly incorporated by reference in their entirety and are hereby expressly made a portion of this application.

FIELD OF THE INVENTION

Semiconductor processing methods are provided relating to (e.g. copper) damascene advanced interconnect applications for integrated circuit (IC) manufacturing, specifically to the production process of copper interconnect structures in the Back End of Line stages of the production process. A method of depositing a selective capping layer on copper interconnect structures to improve electro-migration (EM) resistance is also provided.

BACKGROUND OF THE INVENTION

A commonly used method for forming metal interconnect lines (trenches) and vias in a semiconductor device is known as "damascene". Generally, this method involves forming an opening in a dielectric layer, which separates the vertically spaced metallization layers. The opening is typically formed using conventional lithographic and etching techniques. After the formation, the opening is filled with copper or copper alloys to form a via or a trench. Excess metal material on the surface of the dielectric layer is then removed by chemical mechanical polish (CMP). The remaining copper or copper alloy forms vias and/or metal interconnect lines.

Copper is typically used in the damascene process because of its lower resistivity. However, copper suffers from electro-migration (EM) and stress-migration (SM) reliability issues, particularly as geometries continue to shrink and current densities continue to increase. Therefore, barrier layers are typically formed to prevent copper from diffusing into neighbouring low-k dielectric materials. Recently, copper silicide nitride layers are increasingly used as barrier layers.

In order to maintain narrow lines reliability performances, Cu/low k interconnect architectures including Self Aligned Barriers on top of Cu lines are widely investigated as an effective solution for the 45 nm generation and beyond. Indeed, electromigration is a major concern for narrow Cu lines coated by dielectric barriers such as SiCN, SiCH and SiCO. Alternative approaches with self aligned barriers are already implemented to improve interconnect performance.

Gosset et al. (Self Aligned Barrier Approach: Overview on Process, Module Integration and Interconnect Performance Improvement Challenges, International Interconnect Technology Conference, 2006 IEEE) describes a self aligned barrier (capping layer) integration, using either a Cu line surface treatment or a selective deposition process on top of the Cu lines. A CuSiN capping layer has been developed for its direct compatibility with existing PE-CVD processes and tools. It consists in a three steps process wherein first the native Cu oxide is removed using reducing plasmas (e.g. $H_2$-based plasmas). In a second step, Cu silicidation, copper is enriched with Si atoms using Si-based precursor decomposition (CVD) such as silane or tri-methyl silane. Finally, a $NH_3$ plasma is performed to achieve the CuSiN self aligned barrier.

Usami et al. (Highly Reliable Interface of Self-aligned CuSiN process with Low-k SiC barrier dielectric (k=3.5) for 65 nm node and beyond, International Interconnect Technology Conference, 2006 IEEE) describes also the deposition of a CuSiN self aligned barrier. In a first step, after planarizing the wafer (Cu-CMP), a reducing plasma was applied to remove surface copper oxide. In a second step, $SiH_4$ gas was exposed on copper surface to diffuse silicon atoms into the copper film. In a third step, post nitrogen containing plasma was applied to scavenge the excess silicon atom and generate Si—N bonds for silicon pinning. Finally, the low k SiC barrier film is deposited on the copper lines. SiC was deposited in a conventional PE-CVD reactor using a more complex organic methyl silane source than the standard precursor used for SiCN (k=4.9) deposition.

In U.S. Pat. No. 6,821,890 a process is disclosed to provide an intervening capping layer of copper germanide, germanide oxide, germanium nitride or combinations thereof to improve adhesion of poorly adhering material onto the copper surface.

The conventional formation process of barrier layers such as copper silicide still suffers from drawbacks. Since copper silicide is relatively unstable, silicon may still break from copper silicide and diffuse into low-k dielectric layer. Therefore, it is preferred that copper silicide layer is fully nitrated to form copper silicide nitride, which is more stable. This requires long $NH_3$ plasma treatment and/or high power. However, plasma treatments have the side effect of incurring damage to low-k dielectric layer.

The use of copper germanide as a capping layer has the advantage of being more stable and having a lower resistivity. However, copper germanide (and nitrided copper germanide) suffers from worse electromigration performance compared to a (nitrided) copper silicide capping layer.

SUMMARY OF THE INVENTION

The conflicting requirements and needs for a suitable capping layer requires the need for a new capping layer composition as well as an improved method to provide a suitable capping layer which avoids e.g. damage to the surrounding dielectric material(s).

A novel capping composition should be such that it combines good barrier performance (avoiding Cu out diffusing), low resistivity and stability of the capping layer with acceptable (low) sheet resistance increase.

A method is provided for obtaining at least one selective capping layer on Cu interconnect structures whereby the capping layer has improved electro-migration (EM) resistance and in combination therewith good barrier performance and acceptable and stable metal sheet resistance (Rs).

An improved fabrication process (of a capping layer) as well as a novel capping layer composition are provided.

One aspect provides a method for, preferably selectively, forming (or providing, or depositing) a capping layer 6 comprising Cu, N, and also Si and/or Ge onto (or on top of) a copper conductive structure 2, said method comprising the sequential steps of:

forming (or providing, or depositing), at a temperature range between 200° C. up to 400° C., at least one capping layer 4, preferably selectively, onto said copper conductive structure by exposing said structure to a $GeH_4$ and/or a $SiH_4$ comprising ambient 3, performing a $NH_3$ plasma treatment 5 thereby forming an at least partly nitrided capping layer, forming (or providing, or depositing) a dielectric barrier layer 7 onto (on top of) said at least partly nitrided capping layer, characterized in that:

prior to said step of forming said at least one capping layer a pre-annealing step of said copper conductive structure is performed at a temperature range between 250° C. up to 450° C.

Preferably, the wording "selectively forming a layer" as used herein means "forming said layer onto (or on top of)" the Cu structure.

Preferably, the copper conductive structure is meant to form vias and/or metal interconnect lines in a semiconductor device according to the preferred embodiments.

Preferably, the wording "at least partly nitrided capping layer" as used herein means that the capping layer is at least partly saturated with nitrogen.

Preferably, in a method according to preferred embodiments, said pre-annealing step of said copper conductive structure is performed (immediately or not) after chemical mechanical planarizing (CMP) the Cu-surface.

Preferably, in a method according to the preferred embodiments, said pre-annealing step of said copper conductive structure is performed at a temperature range between 300° C. up to 450° C., more preferably between 350° C. up to 450° C., and even more preferably between 350° C. up to 400° C.

Preferably, in a method according to the preferred embodiments, said pre-annealing step of said copper conductive structure is performed for at least 15 minutes, preferably for at least 30 minutes.

More preferably, said pre-annealing step of said copper conductive structure is performed at (about) 400° C.

Preferably, said (additional) pre-annealing step differs significantly from the (pre)heating performed in the CVD reactor prior to deposition (prior art method).

More preferably, the amount of energy applied during said (additional) pre-annealing step differs from the amount of energy applied during said (pre)heating performed in the CVD reactor prior to deposition (prior art method).

More preferably, the time of heating of said (additional) pre-annealing step differs from the time of heating of said (pre)heating performed in the CVD reactor prior to deposition (prior art method).

Preferably, said (additional) pre-annealing step of said copper conductive structure is performed at a temperature to have (additional) Cu grain growth.

Preferably, in a method according to the preferred embodiments, $NH_3$ gas is added to said $GeH_4$ and/or $SiH_4$ comprising ambient, thereby, preferably selectively, forming an at least partly nitrided capping layer.

Preferably, in a method according to the preferred embodiments, $NH_3$ gas may be added to said $GeH_4$ and/or $SiH_4$ comprising ambient.

Preferably, in a method according to the preferred embodiments, $NH_3$ gas must be added to said $GeH_4$ and/or $SiH_4$ comprising ambient.

More preferably, said ambient comprises, or preferably consists of, $GeH_4$ mixed with $NH_3$ gas for forming an at least partly nitrided copper germanide ($CuGe_yN_z$) capping layer.

Said $CuGe_yN_z$ capping layer is a material comprising, or preferably consisting of, copper, germanium, and nitrogen.

In said $CuGe_yN_z$ capping layer, y and z are different form zero.

Said $CuGe_yN_z$ capping layer is a material comprising equivalent benefits from germanium and nitrogen.

Said $CuGe_yN_z$ capping layer is a material comprising at least 25% mole fraction of each of germanium and nitrogen.

Said $CuGe_yN_z$ capping layer is referred to as, preferably at least partly, nitrided copper germanide.

Said $CuGe_yN_z$ capping layer is also referred to as copper germanide nitride.

Preferably, in a method according to the preferred embodiments, said ambient comprises, or preferably consists of, $SiH_4$ mixed with $NH_3$ gas for forming an at least partly nitrided copper silicide ($CuSi_xN_z$) capping layer.

Said $CuSi_xN_z$ capping layer is a material comprising, or preferably consisting of, copper, silicon, and nitrogen.

In said $CuSi_xN_z$ capping layer, x and z are different form zero.

Said $CuSi_xN_z$ capping layer is a material comprising equivalent benefits from silicon and nitrogen.

Said $CuSi_xN_z$ capping layer is a material comprising at least 25% mole fraction of each of silicon and nitrogen.

Said $CuSi_xN_z$ capping layer is referred to as, preferably at least partly, nitrided copper silicide.

Said $CuSi_xN_z$ capping layer is also referred to as copper silicide nitride.

Preferably, in a method according to the preferred embodiments, said ambient comprises, or preferably consists of, $GeH_4$ and $SiH_4$ mixed with $NH_3$ gas for forming an at least partly nitrided copper silicon germanide ($CuSi_xGe_yN_z$) capping layer.

Said $CuSi_xGe_yN_z$ capping layer is a material comprising, or preferably consisting of, copper, silicon, germanium, and nitrogen.

In said $CuSi_xGe_yN_z$ capping layer, x, y, and z are different form zero.

Said $CuSi_xGe_yN_z$ capping layer is a material comprising equivalent benefits from silicon, germanium, and nitrogen.

Said $CuSi_xGe_yN_z$ capping layer is a material comprising at least 25% mole fraction of each of silicon, germanium, and nitrogen.

Said $CuSi_xGe_yN_z$ capping layer is referred to as, preferably at least partly, nitrided copper silicon germanide.

Said $CuSi_xGe_yN_z$ capping layer is also referred to as copper silicon germanide nitride.

Said $CuSi_xGe_yN_z$ capping layer is referred to as a combined capping layer.

Preferably, in a method according to the preferred embodiments, after said step of forming said at least one capping layer or after said step of performing said $NH_3$ plasma treatment, the step of forming said at least one capping layer is repeated for forming a stack comprising, or preferably consisting of, two capping layers, one comprising a partly nitrided copper germanide ($CuGe_yN_z$) capping layer and another one comprising a partly nitrided copper silicide ($CuSi_xN_z$) capping layer.

Preferably, said step of forming said at least one capping layer is repeated for improving the quality of said capping layer(s).

Preferably, repeating said step of forming said at least one capping layer for forming a stack comprising, or preferably consisting of, two capping layers is performed, preferably subsequently, after performing said (first) step of forming said at least one capping layer.

Preferably, repeating said step of forming said at least one capping layer for forming a stack comprising, or preferably consisting of, two capping layers is performed, preferably subsequently, after performing said step of performing said $NH_3$ plasma treatment.

Said stack comprising, or preferably consisting of, two capping layers, one comprising a partly nitrided copper germanide ($CuGe_yN_z$) capping layer and another one comprising a partly nitrided copper silicide ($CuSi_xN_z$) capping layer, is referred to as a dual capping layer.

Preferably, in a method according to the preferred embodiments, said $GeH_4$ and/or $SiH_4$ comprising ambient comprises (besides $NH_3$) an inert gas such as nitrogen ($N_2$).

Preferably, in a method according to the preferred embodiments, a thermal anneal step is performed after said step of forming said capping layer(s), after said step of forming said at least partly nitrided capping layer(s), and/or after said step of forming said dielectric barrier layer.

Preferably, after the step of forming said at least one capping layer a thermal anneal step is performed.

Preferably, after the step of performing a $NH_3$ plasma treatment a thermal anneal step is performed.

Preferably, after the step of forming a dielectric barrier layer a thermal anneal step is performed.

Preferably, in a method according to the preferred embodiments, said step of pre-annealing said copper structure and said step of, preferably selectively, forming said capping layer(s) and/or said partly nitrided capping layer(s) are performed in the same chamber.

Preferably, in a method according to the preferred embodiments, said step of pre-annealing said copper structure and said step of, preferably selectively, forming said capping layer(s) and/or said partly nitrided capping layer(s) are performed in another chamber.

Another aspect provides a preferably self-aligned, at least partly nitrided copper silicon germanide ($CuSi_xGe_yN_z$) capping layer on top of (or onto) an embedded copper conductive structure obtainable by a method according to the preferred embodiments.

Preferably, a "self-aligned layer" as used herein means "a layer selectively formed onto (or on top of)" the Cu structure.

The self-aligned capping layer is formed only in those areas in which the copper structure is in direct contact with silicon and/or germanium.

Preferably, said $CuSi_xGe_yN_z$ layer is a material for use as a capping layer.

Preferably, the thickness of said at least partly nitrided copper silicon germanide ($CuSi_xGe_yN_z$) capping layer is in the range of 3 nm up to 20 nm.

Another aspect provides a semiconductor device comprising, or preferably consisting of:
a semiconductor substrate S,
an insulating layer over the semiconductor substrate said insulating layer 1 having an embedded copper conductive structure 2,
a, preferably self-aligned, at least partly nitrided copper silicon germanide ($CuSi_xGe_yN_z$) capping layer 4 on top of the conductive structure 2.

Another aspect provides a semiconductor device comprising, or preferably consisting of:
a semiconductor substrate,
an insulating layer over the semiconductor substrate said insulating layer having an embedded copper conductive structure,
a, preferably self-aligned, capping layer comprising, or preferably consisting of, a stack of two capping layers comprising a partly nitrided copper silicide ($CuSi_xN_z$) capping layer and a partly nitrided copper germanide ($CuGe_yN_z$) capping layer.

Preferably, the thickness of said, preferably self-aligned, capping layer(s) is in the range of 3 nm up to 20 nm.

Preferably, in preferred embodiments, said semiconductor device comprises a dielectric barrier layer covering said, preferably self-aligned, capping layer(s) and said insulating layer.

Another aspect provides a semiconductor device obtainable by a method according to the preferred embodiments.

It is an advantage of certain preferred embodiments that bad adhesion and bad barrier performance are avoided.

It is an advantage of certain preferred embodiments that a Si and/or a Ge diffusion (impurity) path into the copper structure is/are avoided.

It is an advantage of certain preferred embodiments that the Ge and/or Si impurity induced high sheet resistance (Rs) of the copper structure is improved (or reduced).

It is an advantage of certain preferred embodiments that the novel combined capping layer ($CuSi_xGe_yN_z$) or the novel dual capping layer ($CuSi_xN_z/CuGe_yN_z$ or $CuGe_yN_z/CuSi_xN_z$) may combine the benefits of a $CuSi_xN_z$ layer and a $CuGe_yN_z$ layer.

BRIEF DESCRIPTION OF THE DRAWINGS

All drawings are intended to illustrate some aspects and preferred embodiments. Not all alternatives and options are shown and therefore the invention is not limited to the content of the given drawings.

FIGS. 1A up to 1D illustrate schematic views of a Cu structure onto which an improved $CuSi_xN_z$ and/or $CuGe_yN_z$ capping layer is formed according to preferred embodiments.

DETAILED DESCRIPTION OF THE PREFERRED EMBODIMENT

Figure 2:
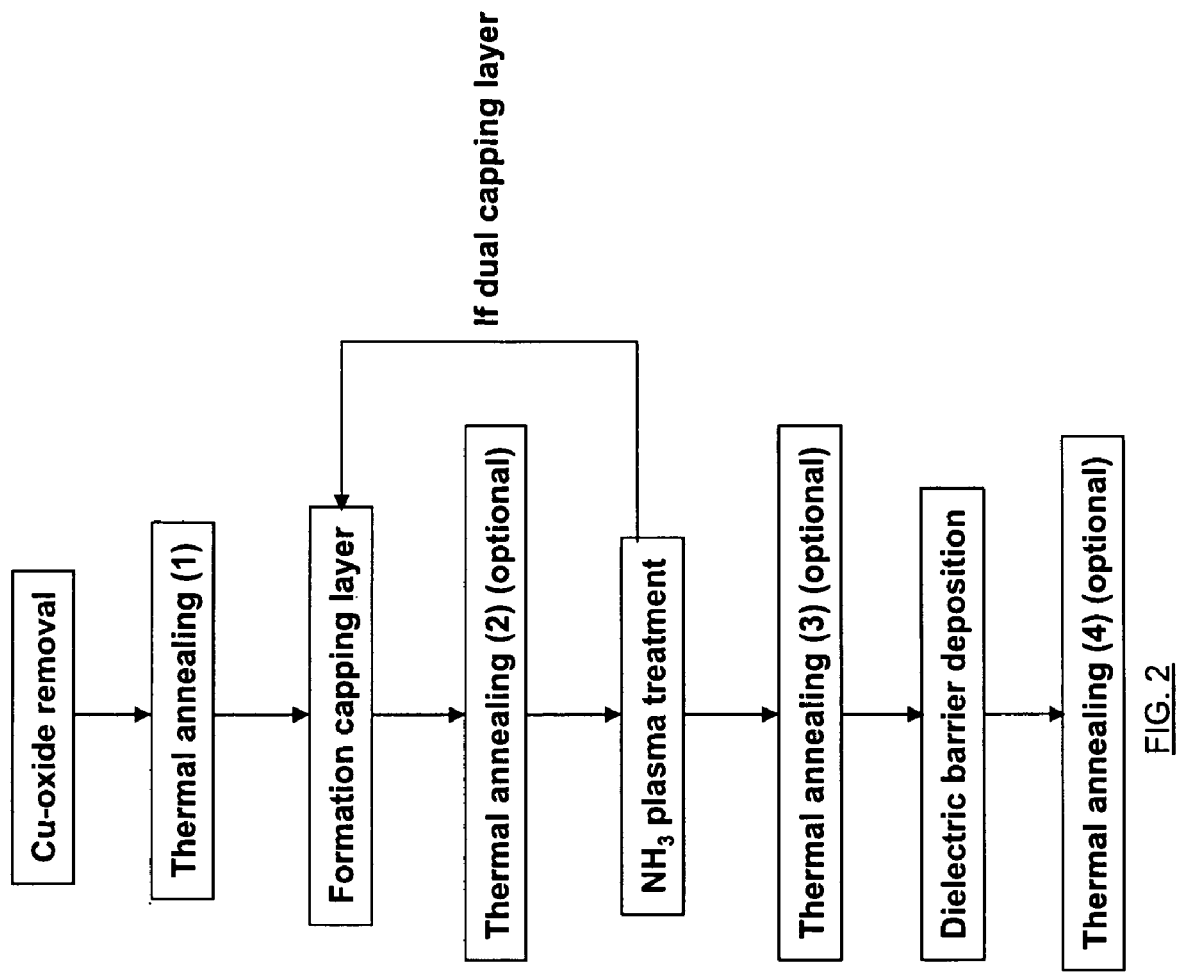
FIG. 2 illustrates a flow chart illustrating a preferred embodiment of the method to provide a $CuSi_xN_z$ and/or $CuGe_yN_z$ (dual) capping layer with improved and stable sheet resistance.
Figure 3:
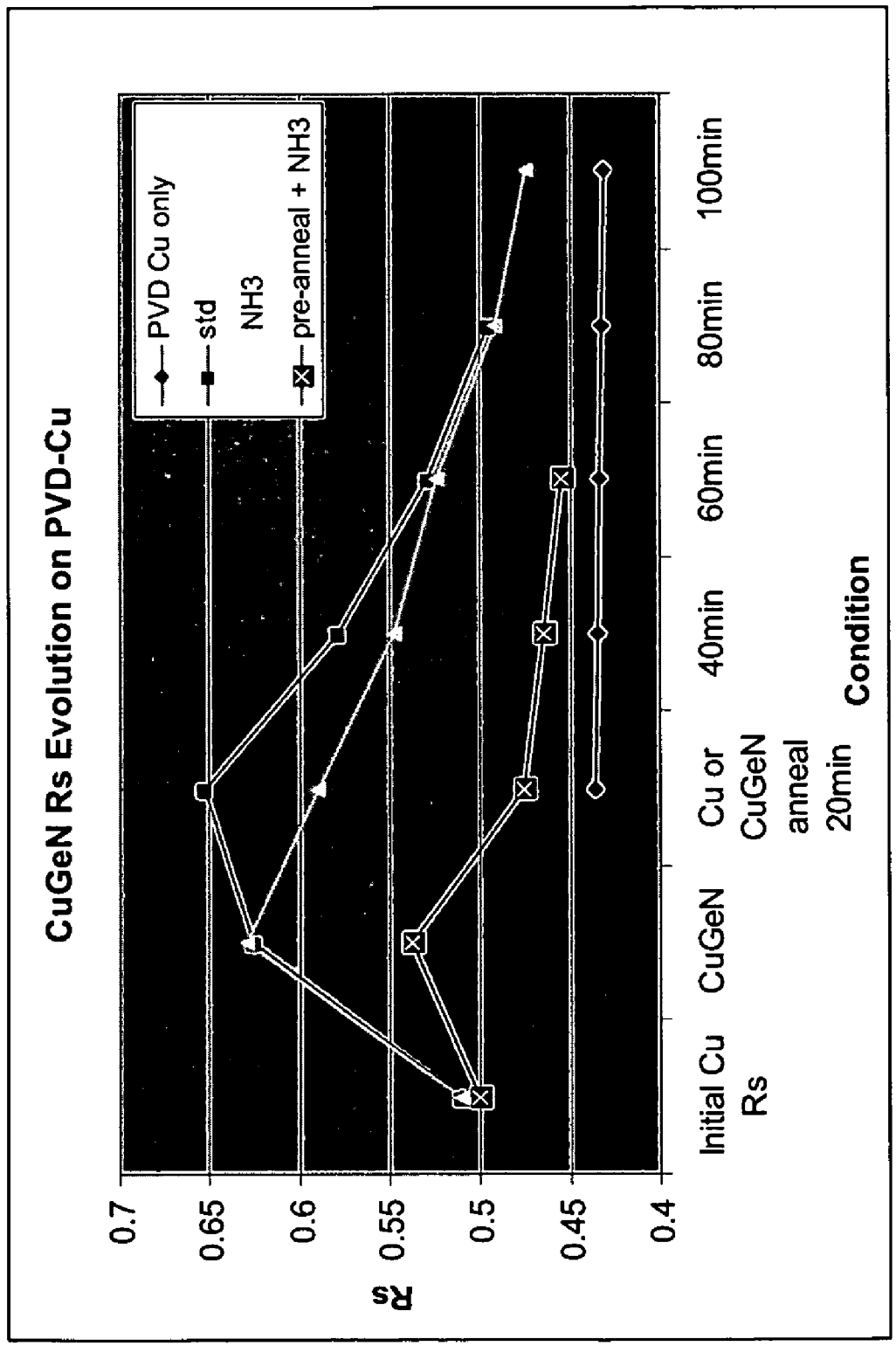
FIG. 3 illustrates the sheet resistance (Rs) evolution of Plasma Vapour Deposited copper (PVD-Cu) having a CuGeN capping layer on top using state of the art processing (std) and using the method according to preferred embodiments compared to PVD-Cu without a CuGeN capping layer.

The preferred embodiments relate to a novel method to provide a capping layer onto a copper interconnect structure thereby avoiding plasma damage and resulting in improved capping layer characteristics such as lower sheet resistance (Rs) increase and good barrier performance (no or negligible Cu out-diffusion). This is achieved by introducing a pre annealing step (annealing the copper interconnect structure) prior to the step of providing the capping layer and/or by the step of introducing $NH_3$ to the $GeH_4/SiH_4$ comprising gas. By introducing $NH_3$ in the $GeH_4/SiH_4$ comprising gas the nitridation of the copper silicide and/or copper germanide occurs during the formation step (of the capping layer).

The preferred embodiments further relate to a novel composition and/or a novel stack of capping layers to be used on top of a copper interconnect structure such as a trench and a via in a (dual) damascene type structure.

The novel composition and/or stacking of layers solve the problem of bad adhesion and bad barrier performance.

Furthermore the novel composition and/or a novel stack of capping layers gives improved electro-migration performance and improved (lower) resistivity.

The novel composition of the capping layer (also referred to as "combined" capping layer) corresponds to a $CuSi_xGe_yN_z$ layer whereas the stack of capping layers (also referred to as "dual" capping layer) corresponds to a $CuSi_xN_z$ and a $CuGe_yN_z$ layer on top of each other.

One aspect of the preferred embodiments relates to a method to selectively provide a capping layer comprising Cu, Si and/or Ge onto (on top of) an embedded copper conductive structure, the method comprising at least the steps of:

Pre-annealing the Cu structure,

Selective growth of at least one capping layer onto the Cu structure by exposing the structure to a $GeH_4$ and/or $SiH_4$ comprising ambient with additional $NH_3$ gas, $NH_3$ plasma treatment, Dielectric barrier deposition.

Preferably, in a method according to the preferred embodiments, the pre-annealing step is performed in a temperature range of 250° C. up to 450° C.

More preferably, the pre-annealing step is performed at 400° C. for 30 minutes.

Preferably, in a method according to the preferred embodiments, the $GeH_4$ and/or $SiH_4$ comprising ambient further comprises (besides $NH_3$) an inert gas such as $N_2$.

Preferably, in a method according to the preferred embodiments, the step of selective growth of at least one capping layer is such that the Cu structure is exposed to an ambient comprising $GeH_4$ and a $CuGe_yN_z$ capping layer is deposited.

Preferably, in a method according to the preferred embodiments, the step of selective growth of at least one capping layer is such that the Cu structure is exposed to an ambient comprising $SiH_4$ and a $CuSi_xN_z$ capping layer is deposited.

Preferably, in a method according to the preferred embodiments, the step of selective growth of at least one capping layer is such that the Cu structure is exposed to an ambient comprising $GeH_4$ and/or $SiH_4$ and a $CuSi_xGe_yN_z$ capping layer is deposited.

Preferably, the step of selective growth of at least one capping layer is repeated twice such that a stacking of two capping layers is achieved of a $CuSi_xN_z$ and a $CuGe_yN_z$ capping layer.

Preferably, in a method according to the preferred embodiments, an additional thermal anneal step is performed after the step of forming at least one capping layer.

Preferably, in a method according to the preferred embodiments, an additional thermal anneal step is performed after the step of performing a $NH_3$ plasma treatment.

Preferably, in a method according to the preferred embodiments, an additional thermal anneal step is performed after the step of depositing a dielectric barrier.

According to a second aspect, a semiconductor device is disclosed, comprising:

A semiconductor substrate,

An insulating layer over the semiconductor substrate said insulating layer having an embedded copper conductive structure, A self-aligned copper silicide (or silicon) germanide nitride ($CuSi_xGe_yN_z$) capping layer on top of the conductive structure.

Preferably, the self-aligned capping layer in a semiconductor device according to preferred embodiments is a stacking of two capping layers made of a $CuSi_xN_z$ and a $CuGe_yN_z$ capping layer.

Preferably, the self-aligned capping layer in a semiconductor device according to the preferred embodiments has a thickness in the range of 3 nm up to 20 nm.

More preferably, the semiconductor device preferred embodiments comprises a dielectric barrier covering (on top of) the self-aligned capping layer and insulating layer.

In a first aspect, a method is provided for depositing at least one a copper germanide nitride ($CuGe_yN_z$) and/or copper silicide nitride ($CuSi_xN_z$) onto (on top of) a copper conductive structure.

FIGS. 1A up to 1D illustrate schematic views of a Cu structure onto which an improved $CuSi_xN_z$ and/or $CuGe_yN_z$ capping layer is formed according to preferred embodiments.

FIG. 2 illustrates a flow chart illustrating a preferred embodiment of the method to provide a $CuSi_xN_z$ and/or $CuGe_yN_z$ (dual) capping layer with improved and stable sheet resistance.

According to preferred embodiments, the method to selectively provide a capping layer comprising Cu, (and also) Si and/or Ge onto (on top of) an embedded copper conductive structure comprises at least the steps of:

Pre-annealing the Cu structure

Selective growth (or formation, or deposition) of at least one capping layer onto the Cu structure by exposing the structure to a $GeH_4$ and/or $SiH_4$ comprising ambient with an additional $NH_3$ source gas $NH_3$ plasma treatment Dielectric barrier deposition According to preferred embodiments the Cu structure is part of single or dual damascene interconnect structure (trench or via).

The Cu structure is embedded in a dielectric layer such as $SiO_2$ and other state of the art low-k dielectric material which are used to isolate interconnect structures.

The dielectric layer is deposited on a semiconductor substrate (e.g. wafer) which further comprises active components.

According to preferred embodiments the capping layer comprises Cu, (and also) Si and/or Ge.

According to preferred embodiments the step of pre-annealing the Cu structure is performed to have additional Cu grain growth.

The additional grain growth on a post Cu-CMP surface or in other words the additional anneal step to achieve grain growth (performed after chemical mechanical planarizing (CMP) the Cu-surface) effectively eliminates defects and grain boundaries which are fast Si and/or Ge diffusing paths.

Certain methods of preferred embodiments solve the problem of avoiding a Si and/or Ge diffusing path by performing a pre-anneal step (immediately or not) after the CMP step.

This step of pre-annealing is preferably performed in temperature range of 250° C. up to 450° C.

A preferred pre-annealing is performed at 400° C. for 30 minutes.

This thermal pre annealing leads to improved Rs of the copper structure.

The pre-annealing step seemed to be mandatory for achieving low Rs of metal line.

The pre-annealing step may be performed in the same chamber into which the deposition of the capping layer takes place, e.g. in a Chemical Vapour Deposition chamber.

The pre-annealing step may be performed by a Rapid Thermal Anneal (RTA).

The step of pre-annealing the Cu structure before formation of the capping layer avoids Ge or Si impurity (diffusion) into the Cu structure from the capping layer or from the $GeH_4$ and $SiH_4$ gases during the formation of the capping layer.

Ge or Si impurity in the Cu grain boundary or interface or Cu grain which will retard the Cu grain growth and increase Cu resistivity can be effectively reduced.

The Ge or Si impurity induced high sheet resistance (Rs) is hence improved.

The step of selectively growing (or forming, or depositing) at least one capping layer onto the Cu structure may be performed by exposing the copper structure to a $GeH_4$ (and/or $SiH_4$) comprising ambient.

The temperature during the step is preferably in the range of 200° C. up to 400° C.

The thickness of the capping layer may be in the range of 3 nm up to 20 nm.

To achieve nitridation during the growth (or formation, or deposition) of the capping layer, $NH_3$ is added to the $GeH_4$ (and/or $SiH_4$) comprising ambient.

The ambient can further comprise inert compounds such as nitrogen gas ($N_2$).

According to preferred embodiments, the step of growing (or forming, or depositing) a capping layer is performed by exposing the pre-annealed Cu structure to a $SiH_4$ ambient to achieve at least a copper silicide capping layer.

Further addition of $NH_3$ during growth (or formation, or deposition) of the capping layer leads to at least a partly nitrided copper silicide layer or $CuSi_xN_z$ layer.

A $CuSi_xN_z$ layer is selectively formed on top of the Cu structure or in other words a self aligned $CuSi_xN_z$ layer is formed.

According to preferred embodiments, the step of growing (or forming, or depositing) a capping layer is performed by exposing the pre-annealed Cu structure to a $GeH_4$ ambient to achieve at least a copper germanide capping layer.

Further addition of $NH_3$ during growth (or formation, or deposition) of the capping layer leads to at least a partly nitrided copper germanide layer or $CuGe_yN_z$ layer.

A $CuGe_yN_z$ layer is selectively formed on top of the Cu structure or in other words a self aligned $CuGe_yN_z$ layer is formed.

According to preferred embodiments, the step of growing (or forming, or depositing) at least one capping layer is such that a dual capping layer is formed made of two capping layers.

The formation of a dual capping layer is performed by first exposing the pre-annealed Cu structure to a $GeH_4$ (or $SiH_4$) ambient to achieve at least a first copper germanide (or silicide) capping layer and then exposing the Cu structure to a $SiH_4$ (or $GeH_4$) ambient to achieve at least a second copper silicide (or germanide) capping layer.

Further addition of $NH_3$ during growth (or formation, or deposition) of the capping layers leads to at least a partly nitrided copper germanide (or silicide) layer or $CuGe_yN_z$ (or $CuSi_xN_z$) layer.

A dual layer containing (or comprising or consisting of) a $CuGe_yN_z$ layer and a $CuSi_xN_z$ layer is selectively formed on top of the Cu structure or in other words a self aligned dual capping layer is formed.

According to preferred embodiments, the at least one capping layer contains Si and Ge to achieve a combined capping layer according to the formula $CuSi_xGe_yN_z$ being able to combine properties of both $CuGe_yN_z$ and $CuSi_xN_z$ layers.

This step of selectively growing (or forming, or depositing) the combined $CuSi_xGe_yN_z$ layer is performed by exposing the Cu surface to a $GeH_4$ and $SiH_4$ comprising ambient wherein $NH_3$ is added (optional).

In case selective growth (or formation, or deposition) of a self aligned $CuSi_xGe_y$ layer is wanted, the Cu surface is exposed to a $SiH_4$ and $GeH_4$ comprising ambient.

In case selective growth (or formation, or deposition) of a self aligned $CuSi_xGe_yN_z$ layer is wanted, the Cu surface is exposed to a $SiH_4$ and $GeH_4$ comprising ambient wherein $NH_3$ is be added.

The addition of $NH_3$ during the formation of the capping layer is beneficial to avoid (reduce) Ge (and/or Si) penetration from the capping layer into the Cu structure.

According to preferred embodiments, an additional thermal anneal step may be performed after the step of forming at least one capping layer.

The nitrogen gas ($NH_3$) addition during the $GeH_4$ or $SiH_4$ thermal reaction with Cu during the $CuGe_yN_z$ and $CuSi_xN_z$ formation may also reduce the mobile/free Ge and Si to penetrate into Cu structure and hence reduce Rs.

According to preferred embodiments, the step of performing a $NH_3$ plasma treatment after growing (or forming, or depositing) the capping layer is performed to achieve a fully nitrided capping layer.

According to preferred embodiments, an additional thermal anneal step may be performed after the step of performing a $NH_3$ plasma treatment to achieve a fully nitrided capping layer.

According to preferred embodiments, the step of depositing a dielectric barrier on top of the at least one capping layer may comprise the deposition of a etch stop layer which has a dielectric constant of less than about 4.

Suitable examples of such layers are silicon carbide (SiC), carbon-doped silicon nitride (SiCN), carbon-doped silicon oxide (SiCO), silicon nitride (SiN), carbon-based materials, as well as germanium carbide (GeC) carbon-doped germanium nitride (GeCN), carbon-doped germanium oxide (GeCO), germanium nitride (GeN), and combinations thereof.

The preferred thickness of the dielectric barrier layer (etch stop layer) is between about 20 nm and about 100 nm.

The dielectric barrier layer can also be formed "in situ" after the formation of the capping layer, for example, if $GeH_4$ and $NH_3$ gases co-exist in a plasma environment, germanium nitride will be formed as a blanket layer fully covering the corresponding wafer.

According to preferred embodiments, an additional thermal anneal step may be performed after the step of depositing a dielectric barrier.

An advantageous feature of the preferred embodiments is that the novel capping layer composition layer (combined layer $CuSi_xGe_yN_z$) or the novel dual capping layer ($CuSi_xN_z/CuGe_yN_z$ or $CuGe_yN_z/CuSi_xN_z$) may combine the benefits of a $CuSi_xN_z$ and a $CuGe_yN_z$ layer.

$CuSi_xN_z$ is known to provide better barrier performance than $CuGe_yN_z$ at Cu out-diffusion. So $CuSi_xN_z$ as a capping layer can allow the use of thinner ESL (SiC, SiCN, SiCNO, and the like) for lower effective-k value.

On the other hand, Si in $CuSi_xN_z$ will diffuse faster than Ge in $CuGe_yN_z$ into the Cu, more pronounced Rs increase for $CuSi_xN_z$ than $CuGe_yN_z$ when they are used as Cu capping layers.

Combining the benefits of $CuSi_xN_z$ and $CuGe_yN_z$: $CuSi_xGe_yN_z$ or $CuSi_xN_z/CuGe_yN_z$ or $CuGe_yN_z/CuSi_xN_z$ stacks can provide good performance for lower Rs increase and anti Cu-out diffusion for lower effective-k.

Figure 4:
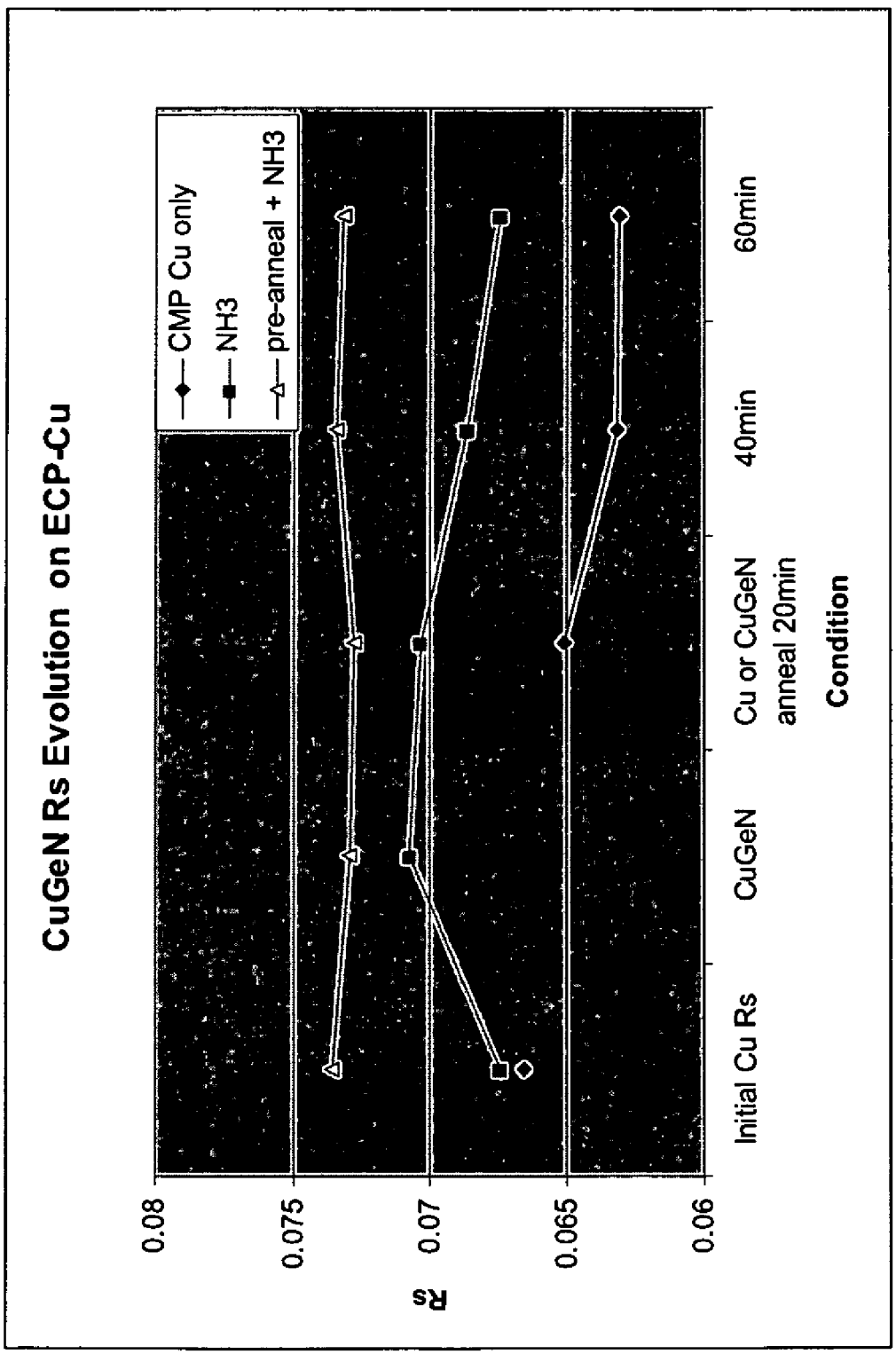
FIG. 4 illustrates the sheet resistance (Rs) evolution of Electrochemically deposited copper (ECP-Cu) having a CuGeN capping layer on top using state of the art processing (std) and using the method according to preferred embodiments compared to ECP-Cu without a CuGeN capping layer. Compared to PVD-Cu, ECP-Cu (having chemical Mechanical processing to planarize the ECP-Cu) has a much thicker initial Cu thickness. For that reason the Rs of ECP-Cu is much lower and has a different starting Rs value compared to PVD-Cu)

FIG. 4 illustrates the sheet resistance (Rs) evolution of electrochemically deposited copper (ECP-Cu) having a $CuGe_yN_z$ capping layer on top using state of the art processing (std) and using the method according to preferred embodiments compared to ECP-Cu without a CuGeN capping layer.

EXAMPLES

Example 1

Formation of a $CuSi_xGe_yN_z$ Capping Layer

Suitable process parameters for depositing a $CuSi_xGe_yN_z$ capping layer (after having performed a thermal (pre) annealing of the copper structure of e.g. 30 minutes at 400° C.) in a Chemical Vapour Deposition (CVD) chamber are summarized below.

pressure ~4 torr
$SiH_4$ flow ~100 sccm
$GeH_4$ flow ~10 sccm
$N_2$ flow ~20000 sccm
$NH_3$ flow ~1000 sccm
Temperature 350° C. for several seconds The process parameters for the "in situ" post $NH_3$ plasma treatment are:
Plasma Power ~500 W
$NH_3$ flow ~1000 sccm
$N_2$ flow ~10000 sccm for ~30 seconds at ~350 C Suitable process parameters for depositing a dual capping layer (stack) $CuSi_xN_z/CuGe_yN_z$ are similar to the condition mentioned above except the sequential use of $GeH_4$ or $SiH_4$.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized preferred embodiments. Accordingly, the appended claims are intended to include within their scope such processes, machines, manufacture, compositions of matter, means, methods, or steps.

What is claimed is:

1. A method for forming a capping layer on a copper conductive structure, wherein the capping layer comprises copper, nitrogen and at least one of silicon and germanium, the method comprising sequential steps of:
pre-annealing a copper conductive structure at a temperature of from about 250° C. to about 450° C.;
forming at least one capping layer on the pre-annealed copper conductive structure by exposing the pre-annealed copper conductive structure to an ambient comprising at least one of $GeH_4$ and $SiH_4$ at a temperature of from about 200° C. to about 400° C.;
performing a $NH_3$ plasma treatment, whereby the capping layer is at least partly nitrided; and
forming a dielectric barrier layer on the at least partly nitrided capping layer.

2. The method of claim 1, wherein the pre-annealing step is performed for at least 15 minutes.

3. The method of claim 1, wherein the pre-annealing step is performed at 400° C.

4. The method of claim 1, wherein the pre-annealing step is performed for at least 30 minutes.

5. The method of claim 1, wherein performing the $NH_3$ plasma treatment is performed by adding $NH_3$ gas to the ambient comprising at least one of $GeH_4$ and a $SiH_4$.

6. The method of claim 5, wherein the ambient comprises $GeH_4$ mixed with $NH_3$ gas, and wherein the at least partly nitrided capping layer is an at least partly nitrided copper germanide capping layer.

7. The method of claim 5, wherein the ambient comprises $SiH_4$ mixed with $NH_3$ gas, and wherein the at least partly nitrided capping layer is an at least partly nitrided copper silicide capping layer.

8. The method of claim 5, wherein the ambient comprises $GeH_4$ and $SiH_4$ mixed with $NH_3$ gas, and wherein the at least partly nitrided capping layer is an at least partly nitrided copper silicon germanide capping layer.

9. The method of claim 1, further comprising forming at least one additional capping layer on the pre-annealed copper conductive structure by exposing the pre-annealed copper conductive structure to an ambient comprising at least one of $GeH_4$ and $SiH_4$ at a temperature of from about 200° C. to about 400° C., wherein the at least one additional capping layer is formed after the step of forming the at least one capping layer or after the step of performing the $NH_3$ plasma treatment, whereby a stack comprising a partly nitrided copper germanide capping layer and a partly nitrided copper silicide capping layer are formed.

10. The method of claim 1, wherein the ambient further comprises an inert gas.

11. The method of claim 1, wherein the ambient further comprises an inert gas, and wherein the inert gas is $N_2$.

12. The method of claim 1, wherein a thermal anneal step is performed after at least one of the step of forming at least one capping layer, the step of performing a $NH_3$ plasma treatment, and the step of forming the dielectric barrier layer.

13. The method of claim 1, wherein the step of pre-annealing the copper structure and at least one of step of forming at least one capping layer and the step of performing a $NH_3$ plasma treatment are performed in a same chamber.

14. The method of claim 1, wherein the step of pre-annealing the copper structure and at least one of step of forming at least one capping layer and the step of performing a $NH_3$ plasma treatment are performed in different chambers.

15. A self aligned at least partly nitrided copper silicon germanide capping layer on top of an embedded copper conductive structure, obtained by the method of claim 1.

16. The self-aligned at least partly nitrided copper silicon germanide capping layer of claim 15, wherein a thickness of the capping layer is from about 3 nm to about 20 nm.

* * * * *